United States Patent
Akasaki

[11] Patent Number: 5,861,670
[45] Date of Patent: Jan. 19, 1999

[54] SEMICONDUCTOR DEVICE PACKAGE

[75] Inventor: Hidehiko Akasaki, Kawasaki, Japan

[73] Assignee: Fujitsu Limited, Kawasaki, Japan

[21] Appl. No.: 651,653

[22] Filed: May 21, 1996

Related U.S. Application Data

[63] Continuation of Ser. No. 824,888, Jan. 22, 1992, abandoned, which is a continuation of Ser. No. 77,946, Jul. 27, 1987, abandoned, which is a continuation of Ser. No. 712,322, Mar. 14, 1985, abandoned, which is a continuation of Ser. No. 198,083, Oct. 17, 1980, abandoned.

[30] Foreign Application Priority Data

Oct. 4, 1979 [JP] Japan .................................. 54-128199

[51] Int. Cl.$^6$ ........................... H01L 23/48; H01L 23/52; H01L 29/40; H01L 23/12
[52] U.S. Cl. ......................... 257/7.37; 257/700; 257/738; 257/780; 438/613
[58] Field of Search ................................. 257/697, 700, 257/737, 738, 780; 438/613

[56] References Cited

U.S. PATENT DOCUMENTS

| | | | |
|---|---|---|---|
| 3,489,845 | 1/1970 | Landron | 357/74 |
| 3,617,817 | 11/1971 | Kawakatsu | 357/74 |
| 3,700,788 | 10/1972 | Spurk | 357/74 |
| 3,729,820 | 5/1973 | Ihochi et al. | 357/74 |
| 3,730,969 | 5/1973 | Buttle et al. | 357/74 |
| 4,082,394 | 4/1978 | Gedney et al. | 357/74 |
| 4,193,082 | 3/1980 | Dougherty | 257/697 |
| 4,288,841 | 9/1981 | Gogal | 361/792 |

FOREIGN PATENT DOCUMENTS 52-58468  5/1977  Japan ........................ 357/80

OTHER PUBLICATIONS

"Bumps and Balls, Pillars and Beams: a Survey of Face–Bonding Methods" George Sideris, *Electronics* Jun. 28, 1965 pp. 68–69.

"Distribution System for Multilayer Ceramic Modules" Z. Markewycz, *IBM Technical Disclosure Bulletin* vol. 19, No. 4, Sep. 1976, pp. 1270–1271.

IBM Technical Disclosure Bulletin, vol. 15, No. 6, pp. 1977–1980, Nov. 1972, "Packaging of Integrated Circuits" C. M. McIntosh and A.F. Schmeckenbecher.

*Primary Examiner*—Mahshid Saadat
*Assistant Examiner*—Allan R. Wilson
*Attorney, Agent, or Firm*—Staas & Halsey

[57] ABSTRACT

An integrated circuits package or a chip carrier having an integrated circuits chip sealed therein comprises layers of ceramic substrates, and terminal steps which are connected to inner pads in contact with the integrated circuits chip and which are provided on the bottom surface of at least one layer of the package, preferably the lowermost layer. The terminal steps are provided in a lattice arrangement, with so many rows of terminal steps as equals the number of terminal steps in one row, thus enabling connection of all of the terminals of the chip to outside wirings, such as wirings of a mother board.

3 Claims, 5 Drawing Sheets

SEMICONDUCTOR DEVICE PACKAGE

This application is a continuation of application Ser. No. 07/824,888, filed Jan. 22, 1992, now abandoned; which is a continuation of application Ser. No. 07/077,946, filed Jul. 27, 1987, now abandoned; which is a continuation of application Ser. No. 06/712,322, filed Mar. 14, 1985, now abandoned; which is a continuation of application Ser. No. 06/198,083, filed Oct. 17, 1980, now abandoned.

BACKGROUND OF THE INVENTION

The present invention is directed to a semiconductor device, and more particularly, to an integrated circuit package (IC package) or a chip carrier which encases a semiconductor device, such as large scale integrated (LSI) circuits, and in which improvements are offered concerning an array of terminal pads for connecting the chip carrier to a mother board.

In the art of electronic packaging to which the present invention pertains a, dual in-line package (DIP), flat package (FP) and plug in type package (PIP) have been widely used. In FIG. 1, front and side views of a typical DIP are shown on top and in the middle. This DIP exhibits significant performance in packaging hybrid integrated circuits and varieties of IC chips. As is generally known, a cavity shown in the front view of FIG. 1 by the dotted line is provided to an insulator body 1 made of alumina ceramic to receive an IC chip. After the chip is secured in the cavity, lead wires are bonded by a known wire bonding technique to electrodes in the periphery or edge of the chip to connect the electrodes to a metallized layer of the ceramic substrate of body 1 which is brazed to radially arranged terminals 2 made of ferro-nickel alloy, for example, to be led to outside wirings. DIP is characterized by two rows of terminals 2 of substantially L-shape configuration as shown in the side view of FIG. 1. The number of terminals and the centerline spacing depend on the packing density and the function of the IC, but an array of 40 terminals with the centerline spacing of 1.27 mm or 2.54 mm is commonly used. Mounting to a printed circuit board is done by means of wave soldering or flow soldering. In the lower part of FIG. 1, there are shown in side-views two modifications of a DIP also used in the industry.

FIG. 2 shows on top a front view of a flat package (FP) used to encase a small sized chip such as a LSI chip. A flat and substantially square ceramic body 1 is formed with a cavity, shown by the dotted line, for the chip. The ceramic substrate is formed with a wiring pattern prepared by a screen print which is brazed to terminals 2 for the purpose of connecting the electrodes of the chip to the outside wiring. A flat package (FP) is distinguished from DIP by the fact that FP is more miniaturized than DIP, and consequently the resistance of wires in the substrate is accordingly low. In the middle of FIG. 2 is shown a side-view of the FP, and at the bottom, a modified FP in side-view. In addition to DIP and FP, there is a plug in package (PIP), not shown, but appearing in Table I below. Whereas terminals extend horizontally from the ceramic body of FP, terminals of PIP are formed by an array of pins of circular cross-section which extend vertically from the bottom of the ceramic body encasing a chip.

Known packages described so far are more or less standardized in their design and dimensions of terminals considering the design requirement of the system using IC packages, the ease in the mounting of the package and circuit assembly. However, the number of terminals per package in the order of 64 is small to meet the current demand. Where a large number of terminals are required as is the case with LSI chips which integrate a large number of logics, the consequence of using known packages described so far is that either it becomes difficult to encase an LSI chip or operational functions of an encased LSI cannot fully be exhibited. In other words, the performance of a DIP is governed primarily by the number of terminals required and not by the size of the LSI. Further, where side notches are formed on four edges of the package with a centerline spacing of 40 to 50 mil, there is a danger of solder bridging when the terminals are soldered.

Multi-layer ceramics or ceramic chip carriers are replacing DIP, FP and PIP where LSI chips are involved. The chip carrier is a substantially square package for integrated circuits. It is made with practically the same materials and processes that have been used in making ceramic DIP's. The chip carrier may be understood as the center portion of the DIP with the two rows of metal leads replaced by contact pads on all four sides thereof. The design of the chip carrier requires a high density interconnection at the substrate level. In a typical multi-layer ceramic substrate, top layers are used to distribute the signal lines from the chip pad grid, first to the top surface then to the internal wiring grid. The center layers of the substrate contain X-Y wiring planes. The bottom layers are used for power distribution and signal redistribution. Via holes between layers allow true three dimensional wiring. An array of pins is formed on the bottom for connecting the carrier to a mother board.

The chip carrier was designed as a leadless package to be connected to a mother board by soldering. The solder makes electrical contact to the chip carrier mechanically holds the package in position. Good alignment of the chip carrier and the mother board is possible when solder pads on the chip carrier and mother board are of the same size and location, more so when a thick solder layer is used. Solder is usually applied to the mother board as a screen printed paste. The wet solder paste holds the chip carrier in approximate position until the solder melts and floats the chip carrier into place. Chip carriers may be soldered to a mother board while other components are attached. For attaching the chip carrier to the mother board, a furnace or belt soldering equipment is used. Infrared heat may be used in reflow soldering. Side notches or via holes are formed on four sides of the chip carrier in many applications for connecting the chip carrier to the mother board. The number of these side notches determines the extent of the function of a semiconductor chip, and with an LSI chip, a problem arises in increasing the number of side notches.

A typical three layer chip carrier is shown in FIG. 3A in substrate fragments. These substrates are laminated to form a chip carrier 11 shown in FIG. 3B. A top layer 12 is a seal ring having a seal pattern 13 of gold-tin-solder, for mounting a top or cover, not shown. Via holes or side notches 14 are formed on four sides of the seal ring. A second layer 12' shown below the seal ring is formed with a die cavity 15, and side notches 14 on its four sides. Bonding pads 16 are formed to surround the die cavity, and are connected to side notches 14 through traces 17. Bonding pads and traces are made in accordance with a conventional metallization process. The bottom layer 12" is provided with a die pad 18 to which a chip is secured. The bottom layer 12" is also provided with side notches 14 which will be connected to a mother board, not shown.

In addition to the foregoing, flip chips have been developed. In a flip chip which is, for example, a transistor chip not encased in any package, bumps are formed by solder on the top surface of the chip. In mounting such a chip to a mother board, the chip is bonded with the top surface down, heat is applied to melt the solder bumps to bond the chip to the mother board.

While the flip chip dispenses with the package, a difficult problem is experienced in aligning the bumps on the chip which are minutely small to terminal pads on the mother board. Further, the mounted chip is unprotected and exposed, thus reducing reliability of the device into which the flip chip has been incorporated.

BRIEF SUMMARY OF THE INVENTION

It is therefore an object of the present invention to overcome the problems experienced in the prior art by a novel chip carrier or IC package which occupies the least possible space on the printed circuit board to which it is mounted and also to minimize the internal wiring within the package, and thus the resistance of lead wires.

Another object of the invention is to offer a chip carrier having a bottom surface on which are formed a plurality of terminal steps or bumps to be bonded to terminal pads on a mother board with an ease of alignment and soldering. The chip carrier is bonded to the mother board with its top surface up, and this means easy handling and mounting of the chip carrier.

Yet another object of the invention is to provide a chip carrier which is well covered and protected, and by which the reliability of the device having the chip carrier mounted thereon is enhanced.

It is a further object of the invention to provide a chip carrier having sufficient number of terminals for connection to the mother board without enlarging its size. At the same time, since the chip carrier is large enough compared to the chip unlike the case with the flip chips, terminal pads on the bottom surface of the substrate are arranged with a sufficient centerline space between each other which facilitates preparation of the pads. To attain the object, the terminal pads may be formed in a lattice arrangement.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

In a chip carrier or IC package which is a preferred embodiment of the invention, inner pads are formed along the periphery of a cavity within which an LSI chip is mounted, and, on the bottom surface of the package opposite to the inner pad, there are formed a plurality of terminal steps or bumps in a lattice arrangement for connecting the package to a mother board.

Figure 4A:
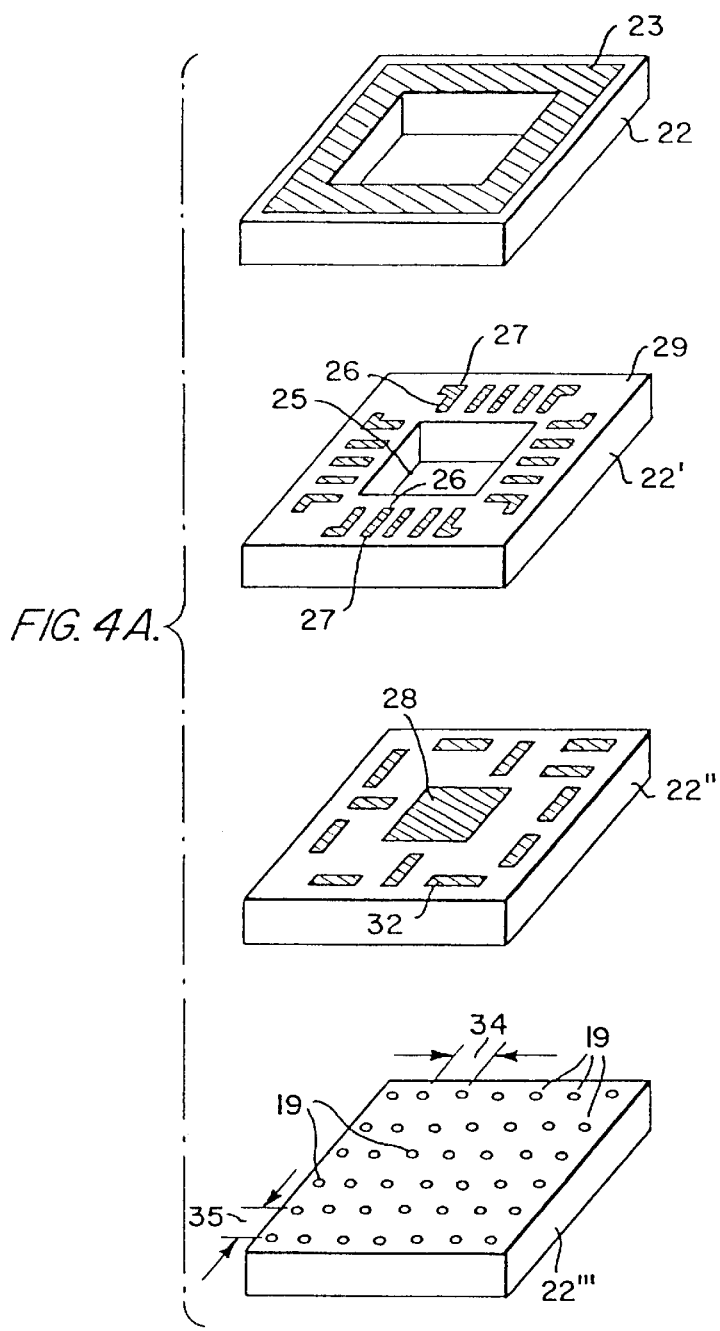
FIG. 4A is a fragmentary picture view of a layered chip carrier in accordance with the present invention, with the bottom layer shown upside down.

Referring to FIG. 4A, there is shown a fragmentary picture view of a chip carrier 21 comprising four layers of ceramic substrates according to the present invention, with the bottom layer 22'''shown upside down. A substantially square seal ring 22 on top has a square opening which is larger than a die cavity to be described. The seal ring 22 has a seal pattern 23 of gold-tin-solder.

Figure 5:
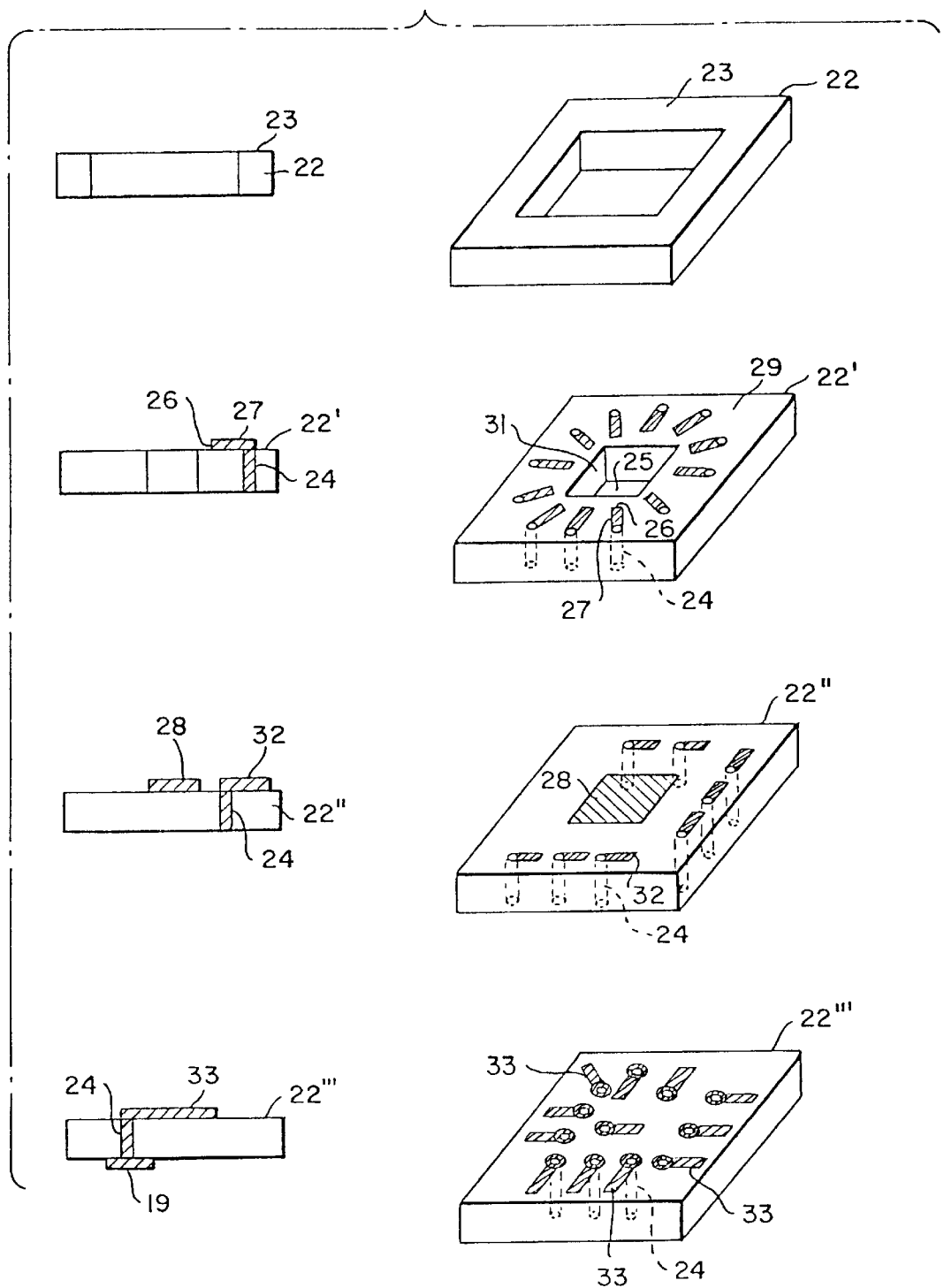
FIG. 5 depicts a fragmentary view of another layered chip carrier according to the invention, with corresponding cross-sectional views of the substrates.

A first substrate layer 22' under the top seal ring 22 is also ring shaped like the seal ring 22, and is formed with a square opening for a die cavity 25. A predetermined number of inner bonding pads 26 and traces 27 are formed on a flat surface 29 to surround the die cavity 25. The traces 27 are led to the bottom surface of the layer 22' through via holes 24 (FIG. 5).

A second substrate layer 22" is formed with a die pad 28 centrally of its upper flat surface surrounded by wirings 32 which connect via holes 24 (FIG. 5) of the layer 22' to via holes 24 (FIG. 5) of the layer 22".

The inner bonding pads 26 offer surfaces to which bonding wires 30 are connected while traces 27 provide upper-end surfaces of inner wirings of the chip carrier, and both are formed by sintering tungsten, for example, on the flat surface of the substrate or the layer 22'.

Figure 2:
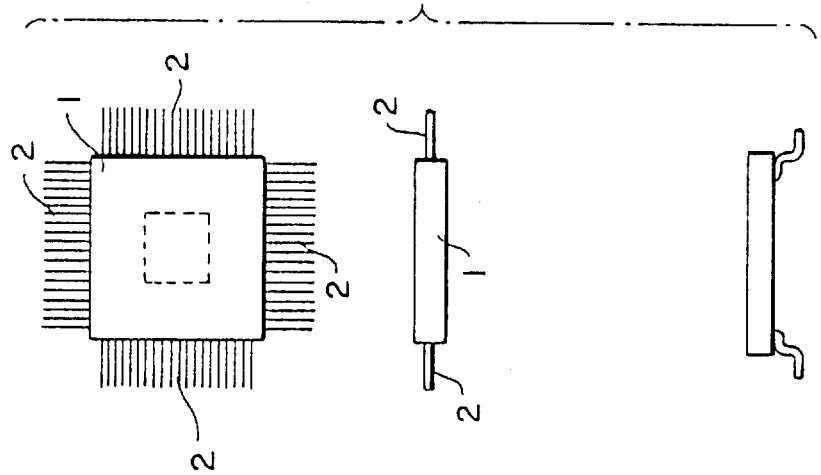
FIG. 2 depicts, at the top and middle, front and side views of a prior art flat package, and, at the bottom, side views of a modification of this package.
Figure 1:
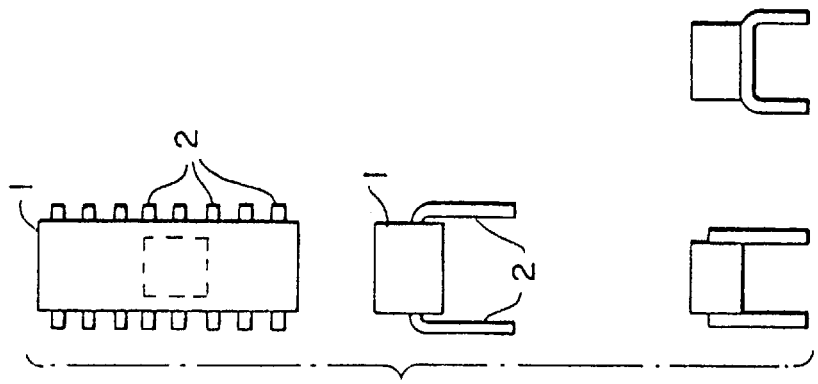
FIG. 1 depicts at the top and middle front and side views of a prior art dual in-line package and, at the bottom, side views of a modification of this package.

Below the layer 22" in FIG. 4A, there is shown a third substrate or a bottom layer 22''' of the chip carrier with its top surface down. The bottom surface of the layer 22''' has thereon a lattice array of a plurality of leadless external terminal steps or bumps 19, the lattice having a lateral centerline spacing 34 and a longitudinal centerline spacing 35 as shown, the steps 19 being situated at the crossings of the lattice. Terminal steps 19 correspond to terminals 2 appearing in FIGS. 1 and 2. These terminal steps 19 form lower end surfaces of inner wirings of the chip carrier. Terminal steps 19 are illustrated in circular form, but they may take any other shape suitable to effect connection to a mother board. Connection of these terminal steps is usually made by reflow soldering.

Figure 3A:
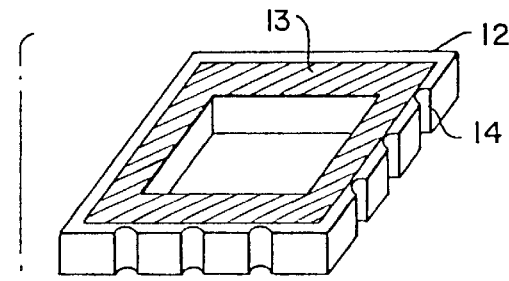
FIG. 3A is a layered fragmentary picture view of a chip carrier according to the prior art.
Figure 3A:
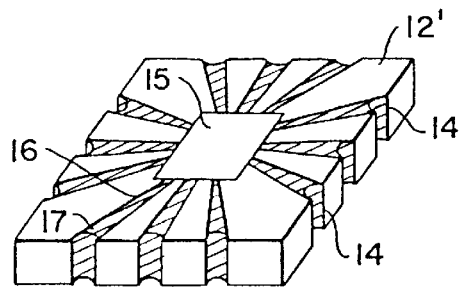
Figure 3A:
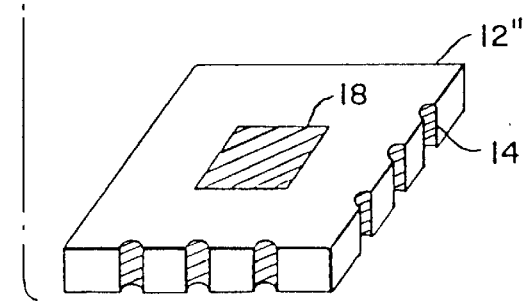
Figure 3B:
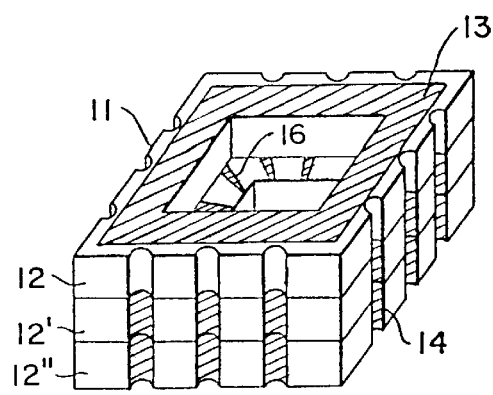
FIG. 3B is a picture view of a chip carrier formed by laminating the substrates of the carrier illustrated in FIG. 3A.
Figure 4B:
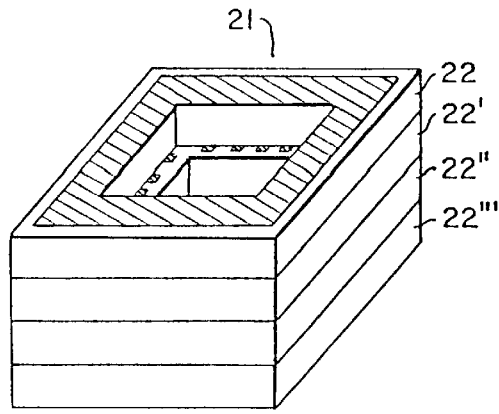
FIG. 4B is a picture view of a chip carrier formed by laminating the substrates of the carrier shown in FIG. 4A.

FIG. 4B shows a chip carrier 21 formed by laminating the substrates illustrated in FIG. 4A. It should be pointed out here that although the chip carrier of this embodiment is not formed with side notches as seen in the carrier of FIG. 3B, side notches may be formed if required so that they form, together with steps 19 of the bottom layer, terminals for connection to the outside.

An outline of the method to manufacture the chip carrier according to the invention will now be described with further reference to FIG. 5 that illustrates a modification of the chip carrier shown in FIG. 4.

In FIG. 5, four layers of ceramic substrates according to the invention are shown in a fragmented view, with schematic picture views at the right and schematic cross-sectional views at the left.

In the manufacture of the chip carrier according to the present invention, conventional multi-layer ceramic technology is employed. First, alumina powder is mixed with glass frit in about a 92:8 ratio, and the mixture is blended with an organic binder and solvents. Slurry thus obtained is cast on a moving belt which carries the slurry through drying ovens for driving off solvents. Dried, unfired (green) ceramic material is next removed from the belt, and blanked into individual greensheets. This last process is generally called personalization.

Alignment holes are then punched in four corners of each greensheet, followed by precision cluster punching in accordance with the desired via hole pattern.

Metallization is carried out by extruding a paste of tungsten-manganese (W-Mn), molybdenum-manganese (Mo-Mn) or tungsten (W) on the greensheet. Punched via holes can be metallized when the greensheet surface is metallized according to the desired pattern.

Inspected personalized greensheets are stacked according to the predetermined sequence, and laminated together at 50°–80° C. with a pressure in the order of 25 megapascals. Prior to firing, these green laminates are cut into pieces corresponding to final the final layers of the ceramic substrates.

These green laminates are sintered in a kiln at 1600° C. Thereafter, baked laminates or substrates are plated to provide the gold-nickel metallization.

A seal ring 22 which is a top layer has a seal pattern 23 to which a metal cap 38 (FIG. 7) is soldered. A second layer 22' immediately below the layer 22 in FIG. 5 is formed with a cavity 25, surrounded by walls 31, smaller than the opening of the seal ring 22. Internal pads 26 as well as traces 27 provided on a flat surface 29 are metallized in accordance with a predetermined pattern, using a screen print. Via holes 24 are also made by means of known mechanical cluster punching and metallization.

Figure 7:
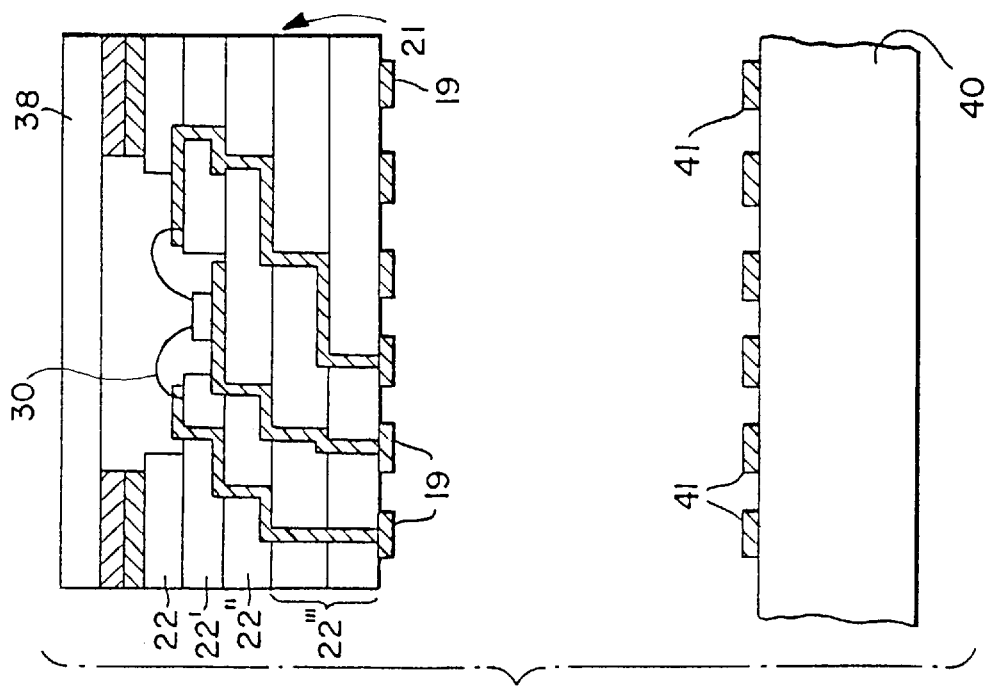
FIG. 7 is a schematic and exploded cross-sectional view of a chip carrier according to the invention and a partial side view of a mother board to which the carrier positioned thereabove is to be mounted.

An intermediate layer 22" below the layer 22' has an interconnection wiring 32 which can be formed in the same manner as traces 27, and a die pad 28 for an LSI chip (FIG. 7). Via hole 24 connects the wiring 32 to a wiring 33 of the bottom layer 22''' to be described.

Figure 6:
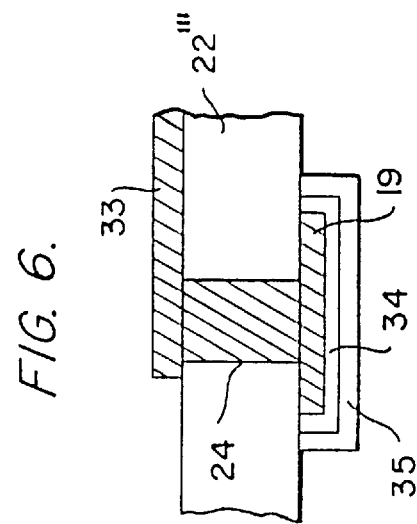
FIG. 6 is an enlarged schematic view of a terminal step or bump on the ceramic substrate of the chip carrier according to the invention.

The bottom layer 22''' serves the purpose of connecting via holes 24 of the intermediate layer 22" to terminal steps or bumps 19. On its upper surface, the bottom layer 22''' is formed with the interconnection wiring 33 connected to a via hole 24 which in turn is connected to one of the terminal steps or bumps 19. Terminal steps 19 are metallized as explained before, and one of such terminal steps is shown schematically in the cross-section view of FIG. 6. The step or bump 19 is plated with nickel 34 and gold 35. In many usual applications, the bottom layer 22''' has itself a multi-layer structure (see, e.g., FIG. 7) and the number of layers is appropriately selected taking into consideration the number of terminal steps 19.

The chip carrier according to the invention can be mounted to a mother board 40 (FIG. 7) conventional reflow soldering using eutectic tin-lead solder (63% Sn and 37% Pb) at a temperature in the range of 220°–250° C. The chip carrier and the mother board are shown in FIG. 7 in a position where terminal steps 19 are aligned above terminal pads 41 of the mother board 40. The solder may be placed on terminal steps 19, or on terminal pads 40 of the mother board, or on both of them. The chip carrier illustrated in FIG. 7 has a bottom layer 22''' formed in a two layer structure.

In a chip carrier 21 according to the present invention, the cavity size is 20 mm×20 mm, and there are 18 rows of 18 terminal steps. The centerline spacing of the inner pattern of steps or bumps 19 is 0.25 mm, possibly with 320 inner pads to form the inner pattern. Comparison of this chip carrier with the dual in-line package (DIP), flat package (FP), plug in package (PIP) and chip carrier (CC) according to the known art is shown in Table I below. The letters in the brackets above are the abbreviations also used in the table below. In the table, comparison is made on the basis that there are 320 or more outer terminals.

TABLE I

| | centerline spacing (mm) of outer pattern | outer dimension | Ratio of area |
|---|---|---|---|
| chip carrier of the invention | 1.27 (324 terminals) | 25 mm × 25 mm | 1 |
| DIP | 2.54 (320 terminals) | 409 mm × 40 mm | 26 |
| FP | 1.27 (320 terminals) | 102 mm × 102 mm | 16.6 |
| PIP | 2.54 (324 terminals) | 49 mm × 49 mm | 3.8 |
| prior art chip carrier (CC) with side notches | 1.02 (320 terminals) | 82 mm × 82 mm | 10.8 |

Note:
The term outer pattern means, in the case of the invention, the terminal steps or bumper 19. With DIP, FP, PIP, this term means the terminals 2. With the prior art chip carrier CC, it means the side notches.

The embodiment described so far and shown in the drawings has a ceramic hermetic seal structure, but it is to be understood that such a structure is also applicable to chip carriers of a resin seal type. In the latter, dimensions given in Table I will be reduced accordingly.

The chip carrier of the invention will be able to meet the requirements of a chip having several hundred terminals by a rational arrangement of terminal pads and connection of inner and outer terminals. And thus, the utility of the chip carrier of the invention will be substantially increased.

The chip carrier of the invention as described is not provided with side notches or side via holes, but it may be manufactured with side via holes on its one side or more sides, if desired.

Thus, the invention having been described in its best embodiment and mode of operation, that which is desired to be protected by Letters Patent is:

What I claim is:

1. An integrated circuit chip package comprising:
   an integrated circuit chip having a generally planar major surface;
   a stack of substrate layers formed from an electrically insulating material, said layers being arranged in said stack as parallel laminations with an upper substrate layer on top of the stack and a lower substrate layer at the bottom of the stack,
   said layers each having generally planar upper and lower surfaces and a number of via holes therethrough, the upper surface of one of said substrate layers providing a die pad area, said chip being mounted at said die pad area with its said major surface disposed in general parallelism to said substrate layers;
   a plurality of electrodes formed on the upper surface of the upper substrate layer;

a series of wires electrically interconnecting said electrodes and said chip;

a plurality of rows of solder bumps formed in a grid like array on the lower surface of the lower substrate layer, said solder bumps being arranged to reflow for direct connection to corresponding terminals of a circuit board, said solder bumps being distributed on the lower surface of the lower substrate layer including an area directly beneath said die pad area, whereby at least four of the solder bumps are located directly beneath said die pad area;

a plurality of wiring elements formed between the substrate layers;

a plurality of metalizing components formed in respective selected ones of said via holes, said wiring elements and said selected via holes being arranged so that said solder bumps and said electrodes are connected together only through said selected via holes; and a sealing component attached to said package above the upper substrate layer and comprising a sealing resin covering and providing a seal for said chip.

2. An integrated circuit chip package comprising:

an integrated circuit chip having a generally planar major surface;

a substrate layer formed from an electrically insulating material, said layer having generally planar upper and lower surfaces and a number of via holes therethrough, the upper surface of said substrate layer providing a die pad area, said chip being mounted at said area of the substrate layer with its said major surface disposed in general parallelism to the upper and lower surfaces of said substrate layer;

a plurality of electrodes formed on the upper surface of said substrate layer;

a series of wires electrically interconnecting said electrodes and said chip;

a plurality of rows of solder bumps formed in a grid like array on the lower surface of said substrate layer, said solder bumps being arranged to reflow for direct connection to corresponding terminals of a circuit board, said solder bumps being distributed on the lower surface of said substrate layer including an area directly beneath said die pad area, whereby at least four of the solder bumps are located directly beneath said die pad area;

a plurality of wiring elements formed between the upper and lower surfaces of the substrate layer;

a plurality of metalizing components formed in respective selected ones of said via holes, said wiring elements and said selected via holes being arranged so that said solder bumps and said desired electrodes are connected together only through said selected via holes; and a sealing component attached to said package above said substrate layer and comprising a sealing resin covering and providing a seal for said chip.

3. An integrated circuit chip package comprising:

an integrated circuit chip having a generally planar major surface;

a stack of substrate layers formed from an electrically insulating material, said layers being arranged in said stack as parallel laminations, said layers each having generally planar upper and lower surfaces, there being a number of via holes formed in said stack, said chip being mounted at a die pad area with its said major surface disposed in general parallelism relative to said substrate layers;

a plurality of electrodes formed on the substrate layers;

a series of electrical interconnections connecting said electrodes and said chip;

a plurality of rows of solder bumps formed in a grid like array on the lower surface of the lowermost substrate layer of the stack, said solder bumps being arranged to reflow for direct connection to corresponding terminals of a circuit board, said solder bumps being distributed substantially throughout the said lower surface of said lowermost substrate layer including an area directly beneath said die pads whereby at least four of the solder bumps are located directly beneath said die pad;

a plurality of wiring elements formed between layers of the stack; and a plurality of metalizing components formed in respective selected ones of said via holes, said wiring elements and said selected via holes being arranged so that said solder bumps and said desired electrodes are connected together only through said selected via holes.

* * * * *

UNITED STATES PATENT AND TRADEMARK OFFICE
CERTIFICATE OF CORRECTION

PATENT NO.    : 5,861,670
DATED         : January 19, 1999
INVENTOR(S)   : Hidehiko Akasaki It is certified that error appears in the above-identified patent and that said Letters Patent is hereby corrected as shown below:

<u>Title page,</u>
Item [63], Related U.S. Application Data, change "No. 198,083, Oct. 17, 1980," to -- No. 189,033, Sept. 22, 1980, --.

<u>Column 1,</u>
Line 9, change "06/198,083, filed Oct. 17, 1980," to -- 06/189,033, filed Sept. 22, 1980, --;
Line 46, after "chip" (first occurrence) insert -- , --; and
Line 56, before "In addition" insert paragraph break.

<u>Column 3,</u>
Line 56, delete "layered"; before "chip" insert -- layered --.

<u>Column 4,</u>
Line 22, change "22''" to -- 22' --.

<u>Column 5,</u>
Line 27, delete "final" (first occurrence).

<u>Column 6,</u>
Line 31, change "bumper" to -- bumps --.

Signed and Sealed this

Eighth Day of April, 2003

JAMES E. ROGAN
*Director of the United States Patent and Trademark Office*